(12) United States Patent
Omizu et al.

(10) Patent No.: US 10,777,569 B2
(45) Date of Patent: Sep. 15, 2020

(54) METHOD FOR MANUFACTURING A SEMICONDUCTOR DEVICE

(71) Applicant: RENESAS ELECTRONICS CORPORATION, Tokyo (JP)

(72) Inventors: Yuto Omizu, Tokyo (JP); Takashi Hashimoto, Tokyo (JP); Hideaki Yamakoshi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/404,095

(22) Filed: May 6, 2019

(65) Prior Publication Data

US 2019/0363095 A1    Nov. 28, 2019

(30) Foreign Application Priority Data

May 24, 2018    (JP) ................. 2018-099321

(51) Int. Cl.

| | |
|---|---|
| *H01L 21/3065* | (2006.01) |
| *H01L 27/11568* | (2017.01) |
| *H01L 27/1157* | (2017.01) |
| *H01L 27/11565* | (2017.01) |
| *H01L 21/762* | (2006.01) |
| *H01L 21/28* | (2006.01) |

(52) U.S. Cl.
CPC ...... *H01L 27/1157* (2013.01); *H01L 21/3065* (2013.01); *H01L 21/76221* (2013.01); *H01L 27/11565* (2013.01); *H01L 29/40117* (2019.08)

(58) Field of Classification Search
CPC ........... H01L 21/8221; H01L 21/76254; H01L 21/76224; H01L 21/31053; H01L 21/31116; H01L 21/76205; H01L 21/823462; H01L 27/11551; H01L 27/11578

See application file for complete search history.

(56) References Cited

U.S. PATENT DOCUMENTS

| 7,303,964 B2 * | 12/2007 | Shiraiwa | ........... H01L 21/76229 257/E21.545 |
|---|---|---|---|
| 7,981,800 B1 * | 7/2011 | Narasimhan | ........ H01L 21/3081 257/E21.218 |
| 2006/0240635 A1 * | 10/2006 | Shiraiwa | ........... H01L 21/76229 438/424 |

FOREIGN PATENT DOCUMENTS

JP    2008-538868 A    11/2008

* cited by examiner

*Primary Examiner* — Caridad Everhart
(74) *Attorney, Agent, or Firm* — McDermott Will & Emery LLP

(57) ABSTRACT

The manufacturing method of the semiconductor device includes a step of forming the gate dielectric film GI2 and the polysilicon layer PS2 on the main surface SUBa of the semiconductor substrate SUB, a step of forming the isolation trench TR in the semiconductor substrate SUB through the polysilicon layer PS2 and the gate dielectric film GI2, a step of filling the isolation trench TR with the dielectric film, and then a step of polishing the dielectric film to form the element isolation film STI in the isolation trench TR. Further, a method for manufacturing a semiconductor device comprises etching the element isolation film STI to retract the upper surface STIa of the element isolation film STI, then further depositing a polysilicon layer on the polysilicon layer PS2 to form a gate electrode using an anisotropic dry etching method.

15 Claims, 16 Drawing Sheets

METHOD FOR MANUFACTURING A SEMICONDUCTOR DEVICE

CROSS-REFERENCE TO RELATED APPLICATIONS

The disclosure of Japanese Patent Application No. 2018-99321 filed on May 24, 2018 including the specification, drawings and abstract is incorporated herein by reference in its entirety.

BACKGROUND

The present invention relates to a method of manufacturing a semiconductor device, and can be suitably used, for example, in a method of manufacturing a semiconductor device having a nonvolatile memory.

EEPROM (Electrically Erasable and Programmable Read Only Memory) is widely used as a nonvolatile semiconductor memory device capable of electrically writing and erasing. These storage devices typified by flash memory which are widely used at present have a conductive floating gate electrode or a charge trapping dielectric film surrounded by an oxide film below a gate electrode of a MISFET, and the charge storage states of the floating gate or the charge trapping dielectric film are used as storage information, and the storage information is read out as thresholds of transistors. The charge trapping dielectric film is a dielectric film capable of storing charges, and an example thereof is a silicon nitride film or the like. By injecting and discharging charges into and from the charge storage region, the threshold of MISFET (Metal Insulator Semiconductor Field Effect Transistor) is shifted to operate as a storage device. When a charge trapping dielectric film such as a silicon nitride film is used as the charge storage region, it has advantages such as thinning of the oxide films located above and below the silicon nitride film because it is excellent in reliability of data retention because charges are stored discretely, and lowering of the voltage of writing and erasing operations, as compared with the case where a conductive floating gate film is used as the charge storage region.

Japanese unexamined Patent Application Publication No. 2008-538868 describes a manufacturing method of a flash memory using a self-aligned STI structure (SASTI). For example, if the etching process of the ONO layer is performed after the STI structure is formed, an ONO residue is generated on the side surface of the STI structure, and the product yield is lowered. Therefore, a manufacturing method of forming an STI structure by patterning an STI trench after forming an ONO layer is disclosed.

SUMMARY

According to the study by the inventors of the present application, in the manufacturing method of a semiconductor device having a nonvolatile memory using a self-aligned STI structure (SASTI), for example, a problem of short-circuiting between neighboring memory gate lines has been confirmed. That is, improvement in reliability is desired in a semiconductor device having a nonvolatile memory.

Other problems and novel features will become apparent from the description of this specification and the accompanying drawings.

According to one embodiment, a method of manufacturing a semiconductor device includes a step of forming a gate dielectric film and a first polysilicon layer on a main surface of a semiconductor substrate, a step of forming an isolation trench in the semiconductor substrate through the first polysilicon layer and the gate dielectric film, and a step of performing a polishing process to an dielectric film after filling the isolation trench with the dielectric film and forming an element isolation film in the isolation trench. Further, the method of manufacturing the semiconductor device includes a step of etching the element isolation film to retract an upper surface of the element isolation film, depositing a second polysilicon layer on the first polysilicon layer, and forming a gate electrode using an anisotropic dry etching method, and the gate dielectric film includes a dielectric film having a charge storage portion.

According to one embodiment, reliability of the semiconductor device can be improved.

DETAILED DESCRIPTION

Figure 1:
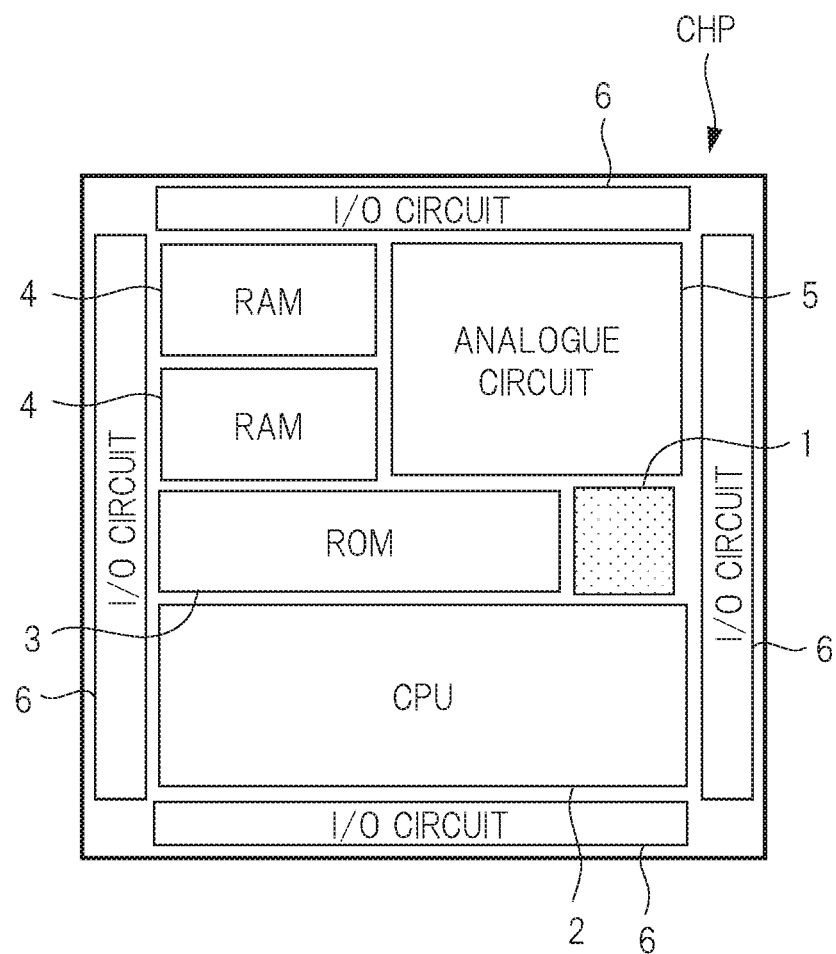
FIG. 1 is a circuit block diagram of a semiconductor device according to present embodiment.

In the following embodiments, when it is necessary for convenience, the description will be made by dividing into a plurality of sections or embodiments, but except for the case specifically specified, these sections and embodiments are not independent of each other, and one of them is related to some or all of modifications, details, supplementary description, and the like of the other. In the following embodiments, the number of elements, (including the number of elements, numerical values, quantities, ranges, etc.) is not limited to the specific number, and may be less or more than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Below, the embodiments will be described in detail by reference to the accompanying drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted in order to make the drawings easier to see even in a cross-sectional view. In addition, even in a plan view, hatching may be used to make the drawing easier to see.

Embodiment

Regarding to Semiconductor Device

Figure 2:
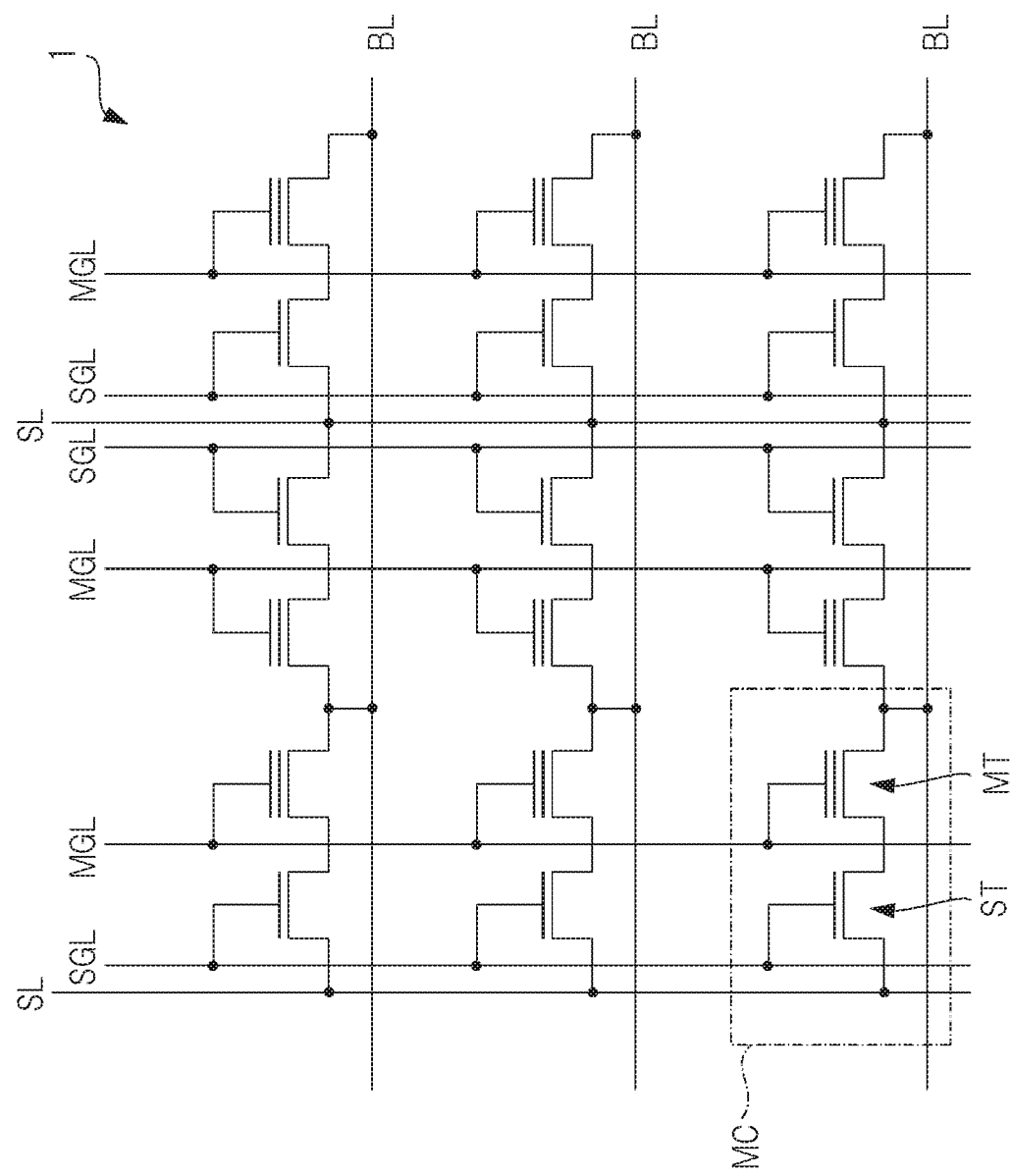
FIG. 2 is an equivalent circuit diagram of a memory cell portion of a nonvolatile memory.
Figure 3:
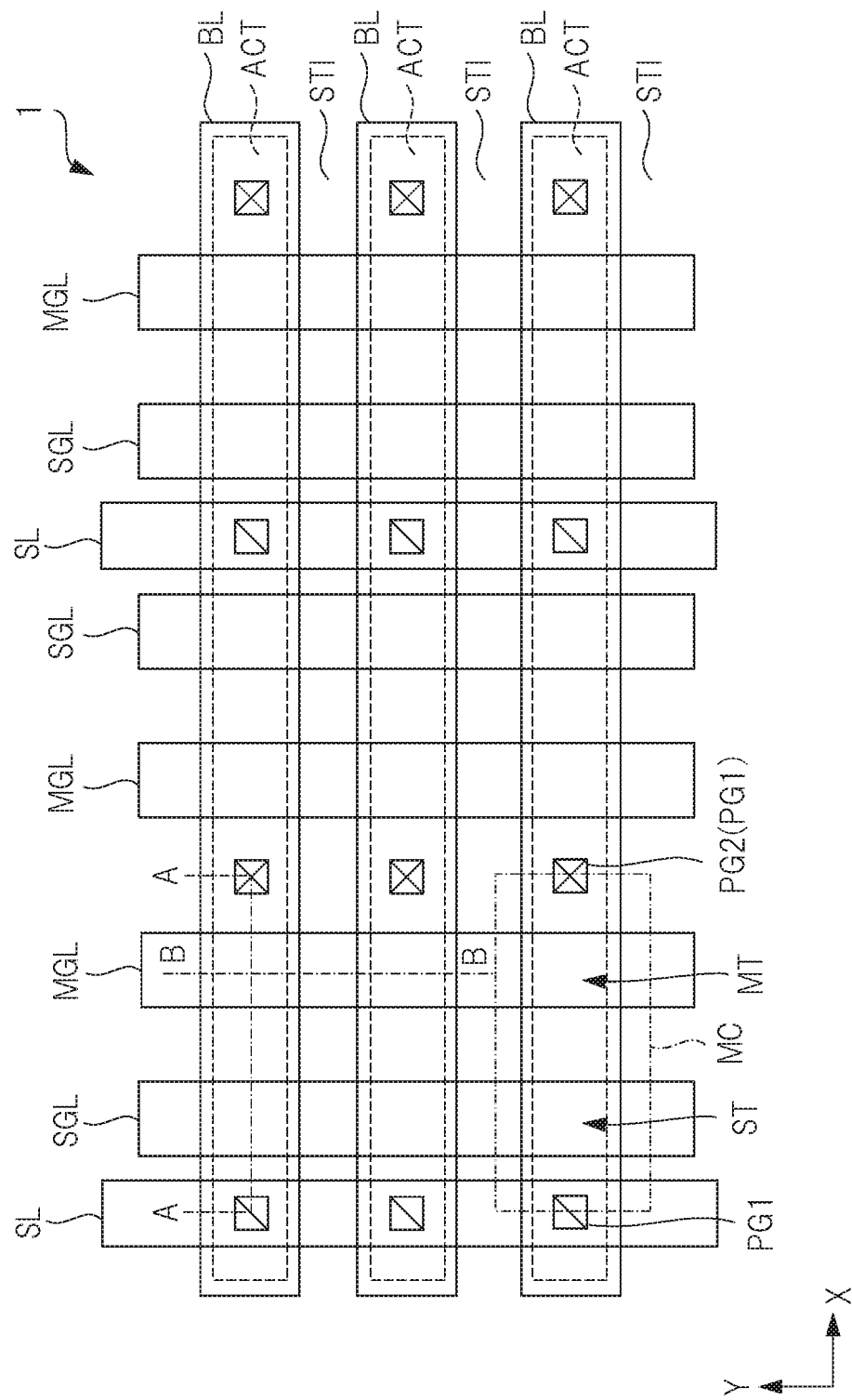
FIG. 3 is a plan view of the main part of the memory cell portion.
Figure 4:
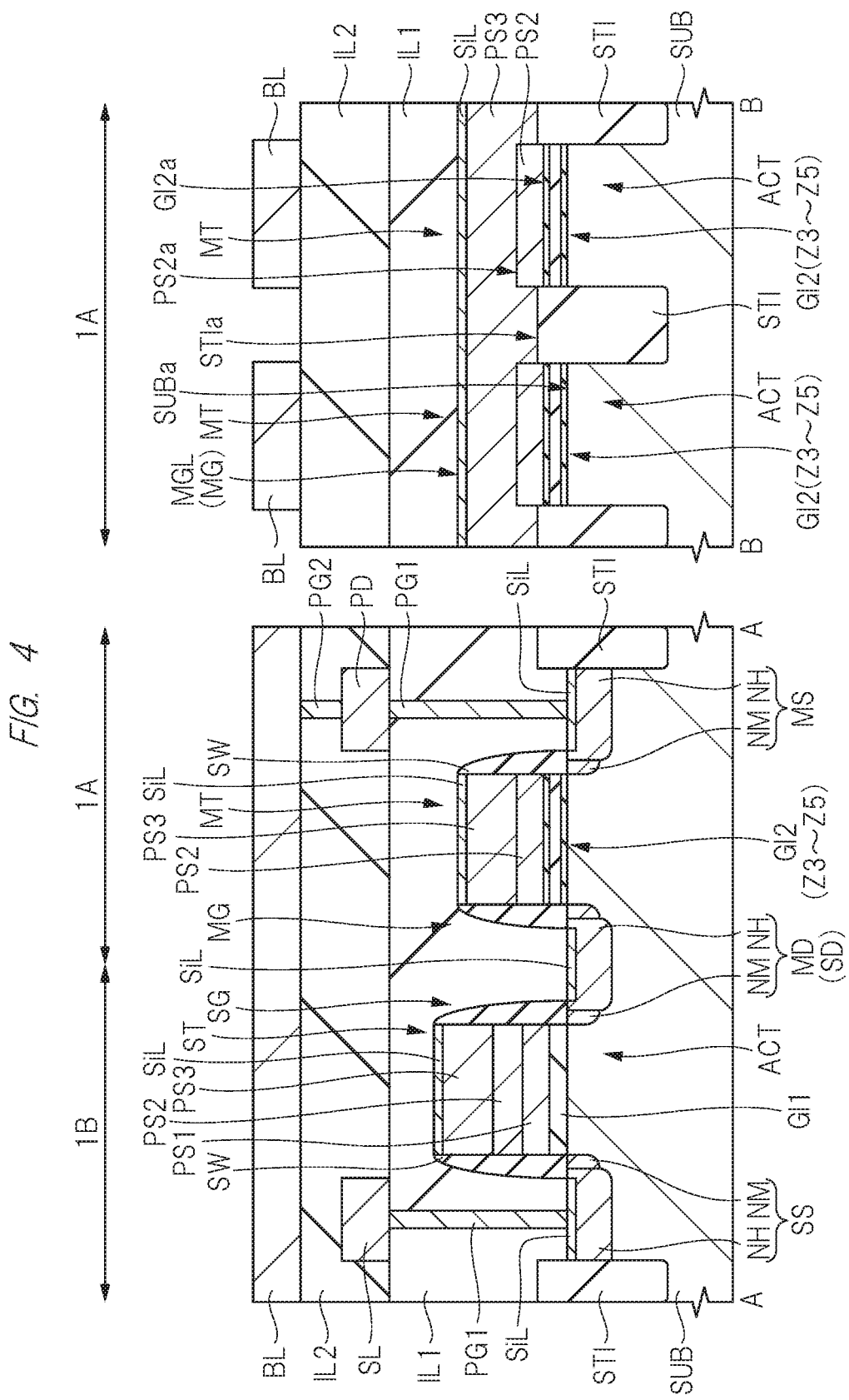
FIG. 4 is a cross-sectional view along lines A-A and B-B of FIG. 3.

FIG. 1 is a circuit block diagram of a semiconductor device (semiconductor chip CHP) according to the present embodiment, FIG. 2 is an equivalent circuit diagram of a memory cell portion of a nonvolatile memory, FIG. 3 is a plan view of a main portion of the memory cell portion, and FIG. 4 is a cross-sectional view along lines A-A and B-B of FIG. 3. In FIG. 4, in a cross-sectional view (referred to as an AA cross-sectional view) taken along the line A-A, a memory transistor MT and select transistor ST constituting one memory cell MC are respectively shown in a memory transistor formation region 1A and a select transistor formation region 1B, and in a cross-sectional view (referred to as a BB cross-sectional view) taken along the line B-B, two adjacent memory transistors MT are shown in the memory transistor formation region 1A.

As shown in FIG. 1, the semiconductor device (semiconductor chip CHP) includes a nonvolatile memory 1, a CPU (Central Processing Unit) 2, a ROM (Read Only Memory) 3, a RAM (Random Access Memory) 4, an analogue circuit 5, and an I/O (Input/Output) circuit 6.

The semiconductor device includes a low withstand voltage MISFET driven by a relatively low voltage, and a high withstand voltage MISFET driven by a relatively high voltage. The CPU 2, the ROM 3, the RAM 4, and the like are mainly composed of a low withstand voltage MISFET, and the nonvolatile memory 1, the analogue circuit 5, and the I/O circuit 6 are mainly composed of a high withstand voltage MISFET. The driving voltages of the high withstand voltage MISFET and the low withstand voltage MISFET are, for example, 3.3 V and 1.8 V. Since the driving voltages differ from each other, the high withstand voltage MISFET has characteristics such as a thicker gate dielectric film and a longer gate length than the low withstand voltage MISFET. The low withstand voltage MISFET includes a p-type low withstand voltage MISFET and an n-type low withstand voltage MISFET, and the high withstand voltage MISFET includes a p-type high withstand voltage MISFET and an n-type high withstand voltage MISFET.

As shown in FIG. 2, the nonvolatile memory 1 includes a large number of memory cells MC arranged in a matrix. The memory cell MC includes a memory transistor MT and a select transistor ST connected in series. The select transistor ST has a structure similar to the structure of the n-type high withstand voltage MISFET described above. Since the memory transistor MT has a charge storage portion, it has a structure of a gate dielectric film different from that of the select transistor ST. One end of the memory cell MC is connected to a bit line BL, and the other end is connected to a source line SL. Further, the memory cell MC is connected to a memory gate line MGL and a select gate line SGL. Although the memory cell MC composed of the memory transistor MT and the select transistor ST is shown here, the nonvolatile memory 1 may be configured by arranging a plurality of memory transistors MT in a matrix form by omitting the select transistor ST.

As shown in FIG. 3, for example, the bit line BL extends in a X direction, and the source line SL, the memory gate line MGL, and the select gate line SGL extend in a Y direction orthogonal to the X direction. One end of the memory cell MC is connected to the bit line BL via the plug electrodes PG1 and PG2, and the other end of the memory cell MC is connected to the source line SL via the plug electrode PG1. A plurality of memory cells MC are formed in active regions ACT extending in the X direction. The plurality of active regions ACT extending in the X direction are arranged in the Y direction at predetermined intervals. In the Y direction, the adjacent active regions ACT are electrically isolated from each other by the element isolation film STI. In the Y direction, two adjacent memory cells MC are arranged in line symmetry with respect to an imaginary line (not shown) extending in the X direction on the element isolation film STI. The two memory cells MC adjacent to each other in the X direction are arranged in line symmetry with respect to an imaginary line (not shown) connecting the plug electrode PG1 connected to the bit line BL in the Y direction, and are arranged in line symmetry with respect to the source line SL extending in the Y direction.

As shown in the AA cross-sectional view of FIG. 4, the memory transistor MT includes a memory gate electrode MG, a source MS, a drain MD, and a gate dielectric film GI2, and the select transistor ST includes a select gate electrode SG, a source SS, a drain SD, and a gate dielectric film GI1. The memory gate electrode MG or the select gate electrode SG extends in the vertical direction of the drawing, and constitutes the memory gate line MGL or the select gate line SGL shown in FIG. 3. In other words, a part of the memory gate line MGL or the select gate line SGL is the memory gate electrode MG or the select gate electrode SG. Although the source MS and the drain MD and the source SS and the drain SD are referred to as shown in FIG. 4 for convenience, the source and the drain may be reversed depending on the potential relationship.

The memory transistor MT and the select transistor ST are formed on the active region ACT of the semiconductor substrate SUB made of, for example, p-type single crystal silicon. The active region ACT is defined by the element isolation film STI. The memory transistor MT and the select transistor ST may be formed on a well region (not shown) which is a p-type semiconductor region formed in the semiconductor substrate SUB.

In the memory transistor MT, the source MS and the drain MD are arranged so as to sandwich the memory gate electrode MG, and are formed in the semiconductor substrate SUB. The memory gate electrode MG is formed on the main surface SUBa of the semiconductor substrate SUB which is a region between the source MS and the drain MD via a gate dielectric film GI2. A region immediately below the gate dielectric film GI2 and between the source MS and the drain MD is a channel formation region. The source MS and the drain MD are n-type semiconductor regions and are composed of n-type semiconductor regions NH and NM, respectively. The semiconductor region NM has a lower concentration than the semiconductor region NH and is provided between the semiconductor region NH and the channel formation region. The memory gate electrode MG has a stacked structure of n-type polysilicon layers PS2 and PS3. The polysilicon layers PS2 and PS3 are electrically connected to each other. The gate dielectric film GI2 has a stacked structure of a dielectric layer Z3, a dielectric layer Z4 formed on the dielectric layer Z3, and a dielectric layer Z5 formed on the dielectric layer Z4. The dielectric layers Z3 and Z5 are made of a silicon oxide film or a silicon oxynitride film, and the dielectric layer Z4 is made of a silicon nitride film. The dielectric layer Z4 is a dielectric film having a charge storage portion (charge storage layer) therein. The dielectric layers Z3 and Z5 have a function as a block layer for preventing the charge in the dielectric layer Z4 having the charge storage portion from leaking to the outside. A silicide layer SiL is formed on the surfaces of the memory gate electrode MG, the source MS, and the drain MD. The silicide layer SiL is formed of, for example, a nickel silicide layer, a nickel platinum silicide layer, or the like. Further, a sidewall dielectric film SW is provided on the sidewall of the stacked structure composed of the gate dielectric film GI2 and the memory gate electrode MG. The sidewall dielectric film SW is formed of a silicon oxide film, a silicon nitride film, a stacked film of a silicon oxide film and a silicon nitride film, or the like.

As shown in the BB cross-sectional view of FIG. 4, the gate dielectric film GI2 of the adjacent memory transistor MT is isolated by the element isolation film STI. That is, in the two adjacent memory transistors MT, the dielectric layer Z4 having the charge storage portion included in the gate dielectric film GI2 is separated by the element isolation film STI. Therefore, it is possible to prevent the charge stored in the charge storage portion of the memory cell MC from migrating to the charge storage portion of the adjacent memory cell MC. Therefore, in the Y direction of FIG. 3, the width of the element isolation film STI can be narrowed, and high integration of the nonvolatile memory 1 can be realized. As shown in the BB cross-sectional view of FIG. 4, in the adjacent memory transistors MT, the polysilicon layers PS2 are separated from each other and electrically connected to each other via the polysilicon layer PS3.

As shown in the AA cross-sectional view of FIG. 4, in the select transistor ST, the source SS and the drain SD are arranged so as to sandwich the select gate electrode SG, and are formed in the semiconductor substrate SUB. The select gate electrode SG is formed on the main surface SUBa of the semiconductor substrate SUB which is a region between the source SS and the drain SD via a gate dielectric film GI1. A region immediately below the gate dielectric film GI1 and between the source SS and the drain SD is a channel formation region. The source SS and the drain SD are n-type semiconductor regions and are composed of n-type semiconductor regions NH and NM, respectively. The semiconductor region NM has a lower concentration than the semiconductor region NH and is provided between the semiconductor region NH and the channel formation region. The select gate electrode SG has a stacked structure of n-type polysilicon layers PS1, PS2, and PS3. The polysilicon layers PS1, PS2, and PS3 are electrically connected to each other. A silicide layer SiL is formed on the surfaces of the select gate electrode SG, the source SS, and the drain SD. Further, a sidewall dielectric film SW is provided on the sidewall of the stacked structure composed of the gate dielectric film GI1 and the select gate electrode SG. The configurations of the silicide layer SiL and the sidewall dielectric film SW are the same as those described above.

Since the memory transistor MT and the select transistor ST are connected in series, the drain MD of the memory transistor MT and the drain SD of the select transistor ST are formed of a common semiconductor region. The memory transistor MT and the select transistor ST are covered with an interlayer dielectric film IL1 formed on the semiconductor substrate SUB. On the interlayer dielectric film IL1, a source line SL and a pad layer PD formed in a first wiring layer are provided, and the source line SL is connected to a source SS of the select transistor ST via a plug electrode (conductor layer) PG1 provided in the interlayer dielectric film IL1. The pad layer PD is connected to the source MS of the memory transistor MT via a plug electrode PG1 provided in the interlayer dielectric film IL1. In addition, the source line SL and the pad layer PD are covered with the interlayer dielectric film IL2 provided on the interlayer dielectric film IL1, and a bit line BL formed in the second wiring layer is provided on the interlayer dielectric film IL2. The bit line BL is connected to the pad layer PD via a plug electrode (conductor layer) PG2 provided in the interlayer dielectric film IL2. That is, the bit line BL is connected to the source MS of the memory transistor MT via the plug electrode PG2, the pad layer PD, and the plug electrode PG1.

The interlayer dielectric films IL1 and IL2 are formed of a silicon oxide film or a stacked film of a silicon oxide film and a silicon nitride film. The first and second wiring layers are composed of conductor layers mainly composed of, for example, an aluminum film or a copper film, and the plug electrodes PG1 and PG2 are composed of conductor layers mainly composed of a tungsten film.

In the semiconductor device (nonvolatile memory 1) of the present embodiment, as shown in the BB cross-sectional view of FIG. 4, the gate dielectric films GI2 (in particular, the dielectric film Z4 having the charge storage portion) of two adjacent memory transistors MT are separated by the element isolation film STI. Therefore, even if the width of the element isolation film STI is reduced in the Y direction of FIG. 3, charges stored in the charge storage portion can be prevented from leaking into the adjacent memory cell MC, and malfunction of the memory cell MC can be prevented. That is, the semiconductor device has a structural characteristic that the upper surface STIa of the element isolation film STI is higher than the upper surface of the gate dielectric film GI2a with reference to the main surface SUBa of the semiconductor substrate SUB.

As shown in the BB cross-sectional view of FIG. 4, the upper surface STIa of the element isolation film STI is lower than the upper surface PS2a of the polysilicon layer PS2 with reference to the main surface SUBa of the semiconductor substrate SUB. According to this configuration, it is possible to prevent a short circuit between adjacent memory gate lines MGL, between adjacent select gate lines SGL, or between adjacent memory gate lines MGL and select gate lines SGL, as shown in FIG. 3.

In addition, it is preferable that the upper surface STIa of the element isolation film STI is higher than the upper surface GI2a of the gate dielectric film GI2, more specifically, the upper surface of the dielectric film Z5. This is because, if the upper surface STIa of the element isolation film STI is made lower than the upper surface GI2a of the gate dielectric film GI2, the gate dielectric film GI2 is etched in an etch-back process described later, and the withstand voltage of the gate dielectric film GI2 is lowered. Similarly, it is preferable that the upper surface STIa of the element isolation film STI is higher than the upper surface GI1a of the gate dielectric film GI1.

Manufacturing Method of Semiconductor Device

Next, a method of manufacturing a memory cell portion of a nonvolatile memory will be described with reference to FIGS. 5 to 14. FIGS. 5 to 14 are cross-sectional views during the manufacturing process of the memory cell portion of the nonvolatile memory, and correspond to the AA cross-sectional view and the BB cross-sectional view shown in FIG. 4.

Figure 5:
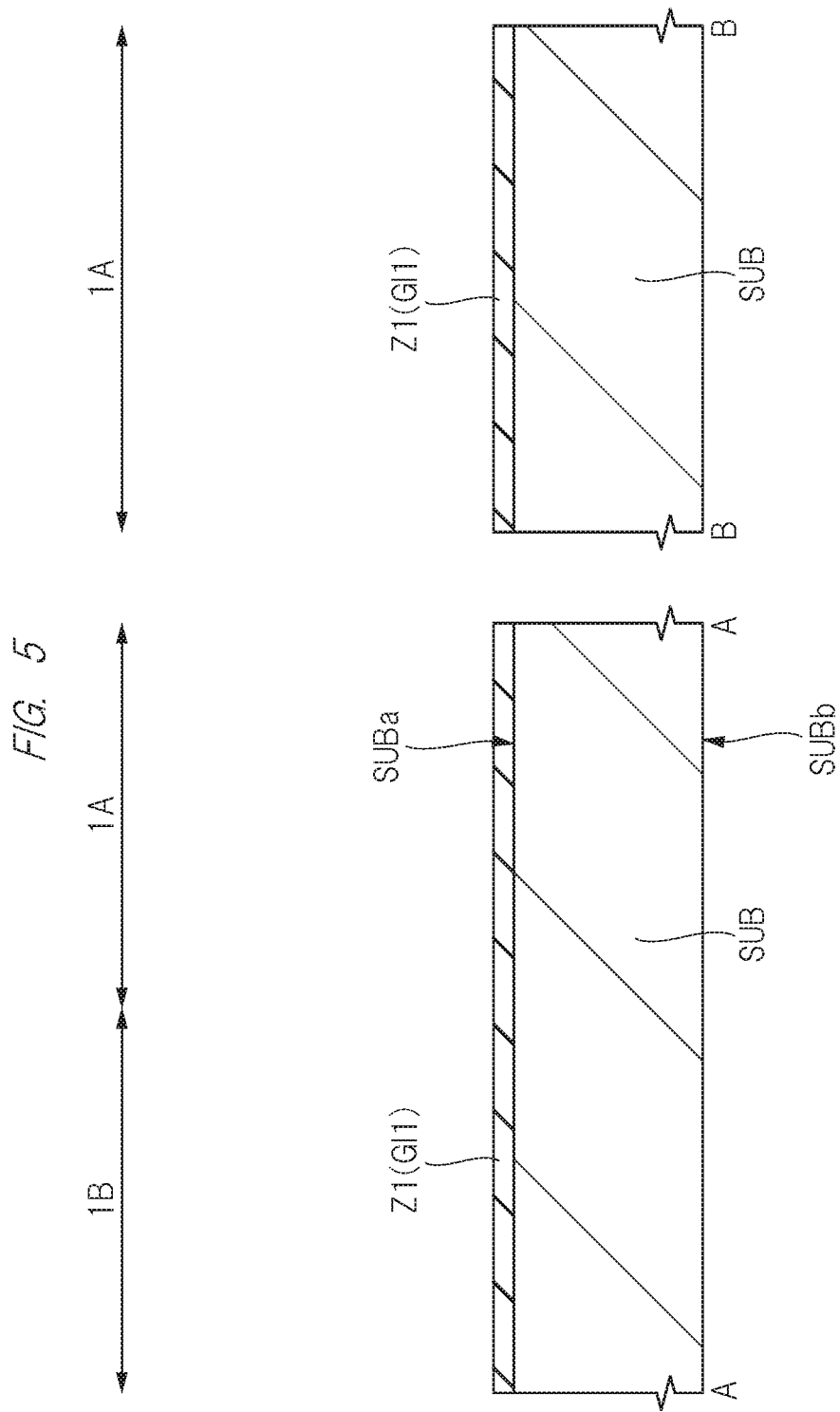
FIG. 5 is a cross-sectional view of a memory cell portion of a nonvolatile memory during a manufacturing process.

First, as shown in FIG. 5, a semiconductor substrate SUB having a main surface SUBa and a back surface SUBb is prepared. The semiconductor substrate SUB is made of, for example, p-type single crystal silicon having a resistivity of about 1 to 18 Ωcm. The main surface SUBa is a surface on which the memory transistor MT and the select transistor ST are formed, and the back surface SUBb is a surface on which the semiconductor substrate SUB is opposed to the main surface SUBa in the thickness direction of the semiconductor substrate SUB. A memory transistor formation region 1A and a select transistor formation region 1B are provided on the main surface SUBa. Next, in the memory transistor formation region 1A and the select transistor formation region 1B, dielectric layer Z1 is formed on the main surface SUBa of the semiconductor substrate SUB. The dielectric layer Z1 is a dielectric film serving as a gate dielectric film GI1 of the select transistor ST. The dielectric layer Z1 is formed of a silicon oxide film having a thickness of, for example, about 7 nm to 8 nm by thermally oxidizing the main surface SUBa of the semiconductor substrate SUB. As the thermal oxidation method, for example, an ISSG (In Situ Steam Generation) oxidation method is used. In the ISSG oxidation method, hydrogen and oxygen are introduced into a reduced-pressure chamber, and radical oxidation is performed on the main surface SUBa of a semiconductor substrate SUB heated to, for example, 800 to 1100° C., thereby forming a silicon oxide film on the main surface SUBa of the semiconductor substrate SUB.

Figure 6:
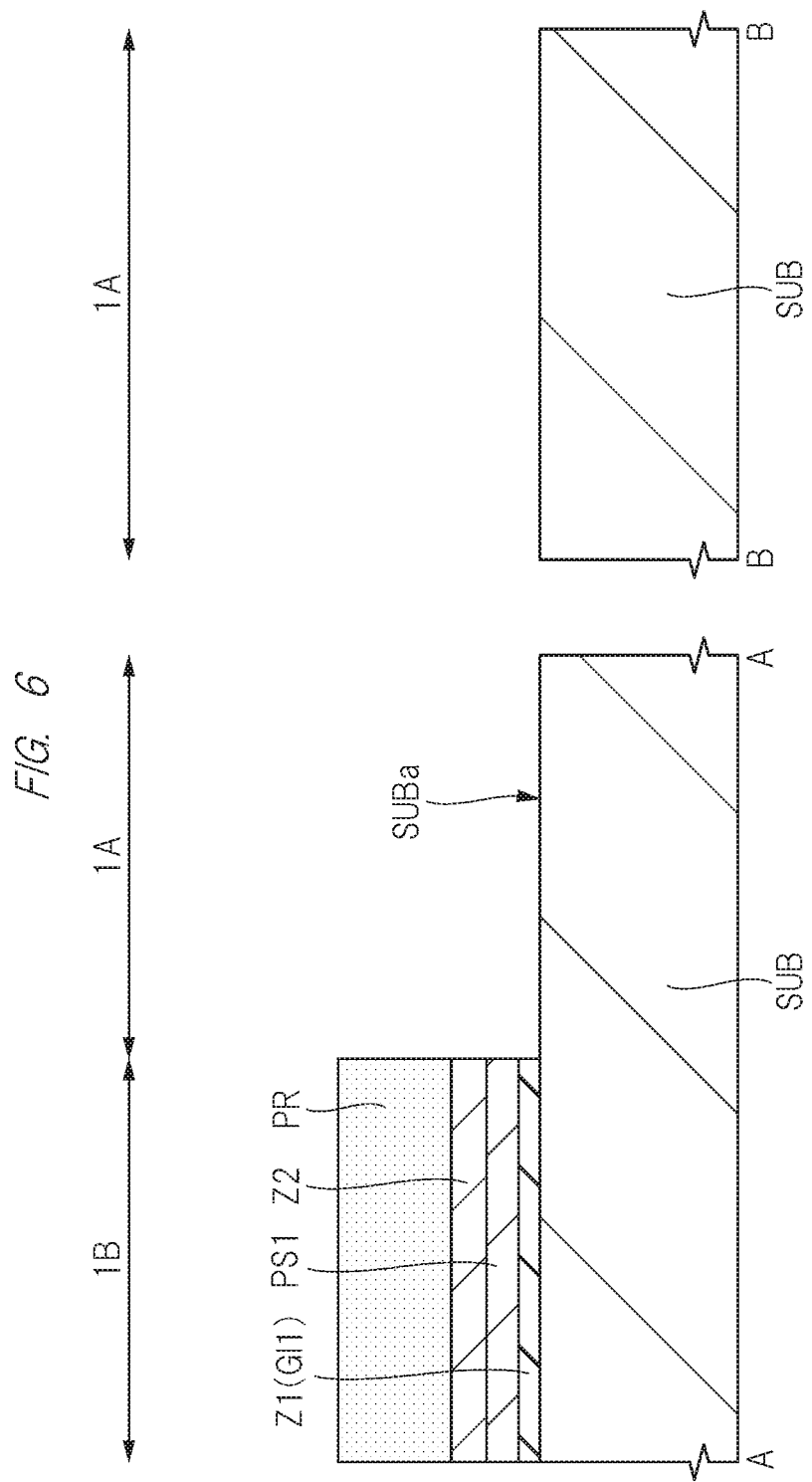
FIG. 6 is a cross-sectional view of a memory cell portion of a nonvolatile memory during the manufacturing process following FIG. 5.

Next, as shown in FIG. 6, the dielectric layer Z1 in the memory transistor formation region 1A is removed, and the dielectric layer Z1 is selectively left in the select transistor formation region 1B. In the memory transistor formation region 1A, the main surface SUBa of the semiconductor substrate SUB is exposed. More specifically, in the memory transistor formation region 1A and the select transistor formation region 1B, the polysilicon layer PS1 and the dielectric layer Z2 are sequentially deposited on the dielectric layer Z1. The n-type polysilicon layer PS1 has a film thickness of, for example, 20 to 30 nm, and the dielectric layer Z2 has a silicon nitride film having a film thickness of, for example, 90 to 100 nm. Next, a photoresist layer PR covering the select transistor formation region 1B and exposing the memory transistor formation region 1A is formed on the dielectric layer Z2. Then, using the photoresist layer PR as a mask, the dielectric layer Z2, the polysilicon layer PS1, and the dielectric layer Z1 of the memory transistor formation region 1A are sequentially removed by an etching method. After the etching is completed, the photoresist layer PR shown in FIG. 6 is removed, and a stacked structure of the dielectric layer Z1, the polysilicon layer PS1, and the dielectric layer Z2 is formed in the select transistor formation region 1B.

Figure 7:
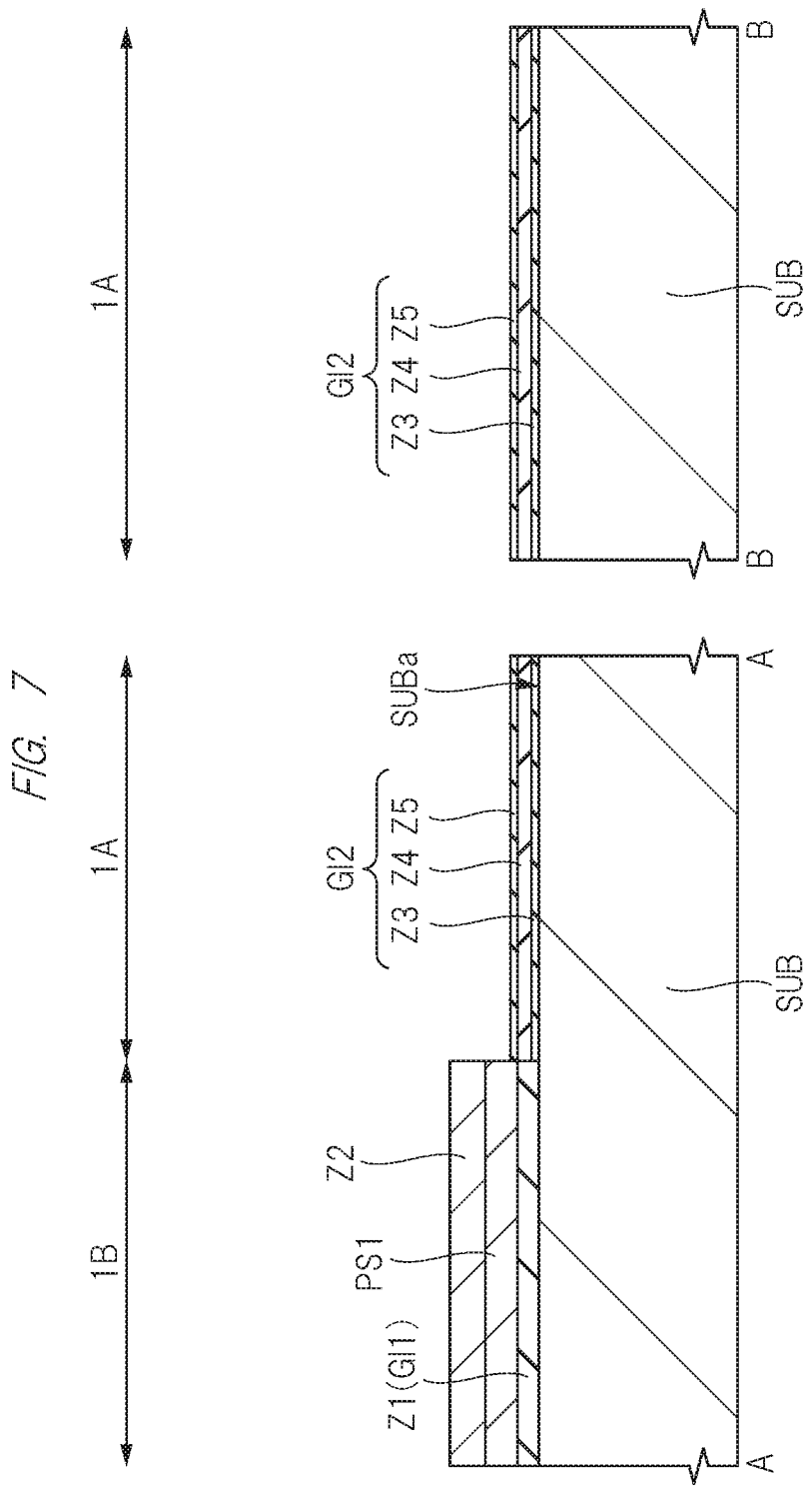
FIG. 7 is a cross-sectional view of a memory cell portion of a nonvolatile memory during the manufacturing process following FIG. 6.

Next, as shown in FIG. 7, a gate dielectric film GI2 made of dielectric layers Z3 to Z5 is selectively formed in the memory transistor formation region 1A. Specifically, the dielectric layers Z3 to Z5 are sequentially formed on the semiconductor substrate SUB. The dielectric layer Z3 is, for example, a silicon oxide film having a thickness of 1 nm to 3 nm, and the dielectric layer Z3 is formed by thermally oxidizing the main surface SUBa of the semiconductor substrate SUB. Note that after the silicon oxide film is formed, thermal nitridation treatment or plasma nitridation treatment can be performed to introduce nitrogen into the silicon oxide film to form a silicon oxynitride film. By performing the nitridation treatment, an increase in the interface level can be suppressed, and a change in the threshold value of the memory transistor MT due to trapping of charges in the interface level can be prevented. Here, since the select transistor formation region 1B is covered with the dielectric layer Z2 made of a silicon nitride film, the dielectric layer Z3 is selectively formed in the memory transistor formation region 1A, and is not formed in the select transistor formation region 1B. Next, a dielectric layer Z4 is deposited on the dielectric layer Z3 by a CVD (Chemical Vapor Deposition) method or the like. The dielectric layer Z4 is made of a silicon nitride film and has a thickness of 6 to 10 nm. The dielectric layer Z4 is formed in the memory transistor formation region 1A and the select transistor formation region 1B. Next, a dielectric layer Z5 is formed on the dielectric layer Z4. The dielectric layer Z5 is formed of a silicon oxide film formed by a CVD method or a thermal oxidation method, and has a thickness of 2 to 4 nm. As the thermal oxidation method, the above-mentioned ISSG oxidation method can be used, and in this case, the dielectric layer Z5 is a silicon oxynitride film. Although not shown, the dielectric layers Z4 and Z5 are formed in the memory transistor formation region 1A and the select transistor formation region 1B.

Next, using a photoresist layer (not shown) as a mask, the dielectric layers Z5 and Z4 of the select transistor formation region 1B are removed by an etching method, and the gate dielectric film GI2 made of a stacked film of the dielectric layers Z3 to Z5 is left only in the memory transistor formation region 1A. Here, since the select transistor formation region 1B is covered with the dielectric layer Z2 made of the silicon nitride film, it is possible to prevent the thickness of the dielectric layer Z1 in the select transistor formation region 1B from increasing in the thermal oxidation process of the dielectric layers Z3 and Z5. Further, in the etching process of the dielectric layers Z5 and Z4, the dielectric layer Z1 can be prevented from being etched. Next, the gate dielectric film GI2 of the memory transistor formation region 1A is covered with a photoresist layer (not shown), and the dielectric layer Z2 of the select transistor formation region 1B is etched and removed. In this etching step, since the dielectric layer Z1 is protected by the polysilicon layer PS1, the film quality of the dielectric layer Z1 can be prevented from deteriorating.

Figure 8:
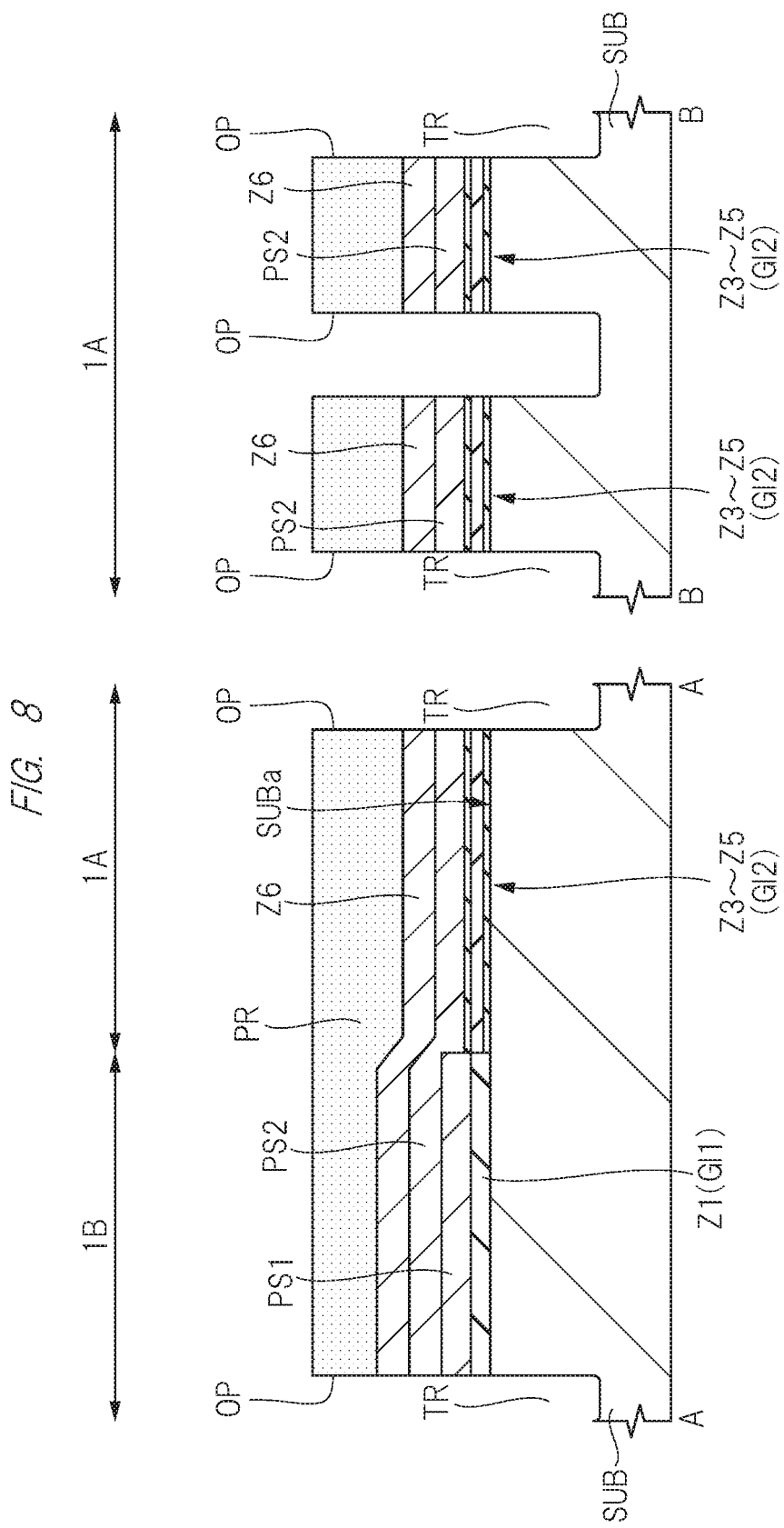
FIG. 8 is a cross-sectional view of a memory cell portion of a nonvolatile memory during the manufacturing process following FIG. 7.

Next, as shown in FIG. 8, isolation trench TR is formed in the semiconductor substrate SUB. Specifically, the polysilicon layer PS2 and the dielectric layer Z6 are sequentially deposited on the gate dielectric film GI2 in the memory transistor formation region 1A and on the polysilicon layer PS1 in the select transistor formation region 1B. The n-type polysilicon layer PS2 is in contact with and electrically connected to the n-type polysilicon layer PS1. The polysilicon layer PS2 has a film thickness of, for example, 20 to 30 nm, and the dielectric layer Z6 has a silicon nitride film having a film thickness of, for example, 90 to 100 nm. Next, a photoresist layer PR having an opening OP corresponding to the formation region of the element isolation film STI is formed on the dielectric layer Z6. Then, isolation trench TR is formed in the semiconductor substrate SUB in region corresponding to the opening OP. The isolation trench TR has a depth of 3 μm to 4 μm from the main surface SUBa of the semiconductor substrate SUB. Here, the isolation trench TR penetrates the dielectric layer Z6, the polysilicon layer PS2, and the gate dielectric film GI2 in the memory transistor formation region 1A, and penetrates the dielectric layer Z6, the polysilicon layers PS2 and PS1, and the gate dielectric film GI1 in the select transistor formation region 1B. Next, the photoresist layer PR shown in FIG. 8 is removed.

Figure 9:
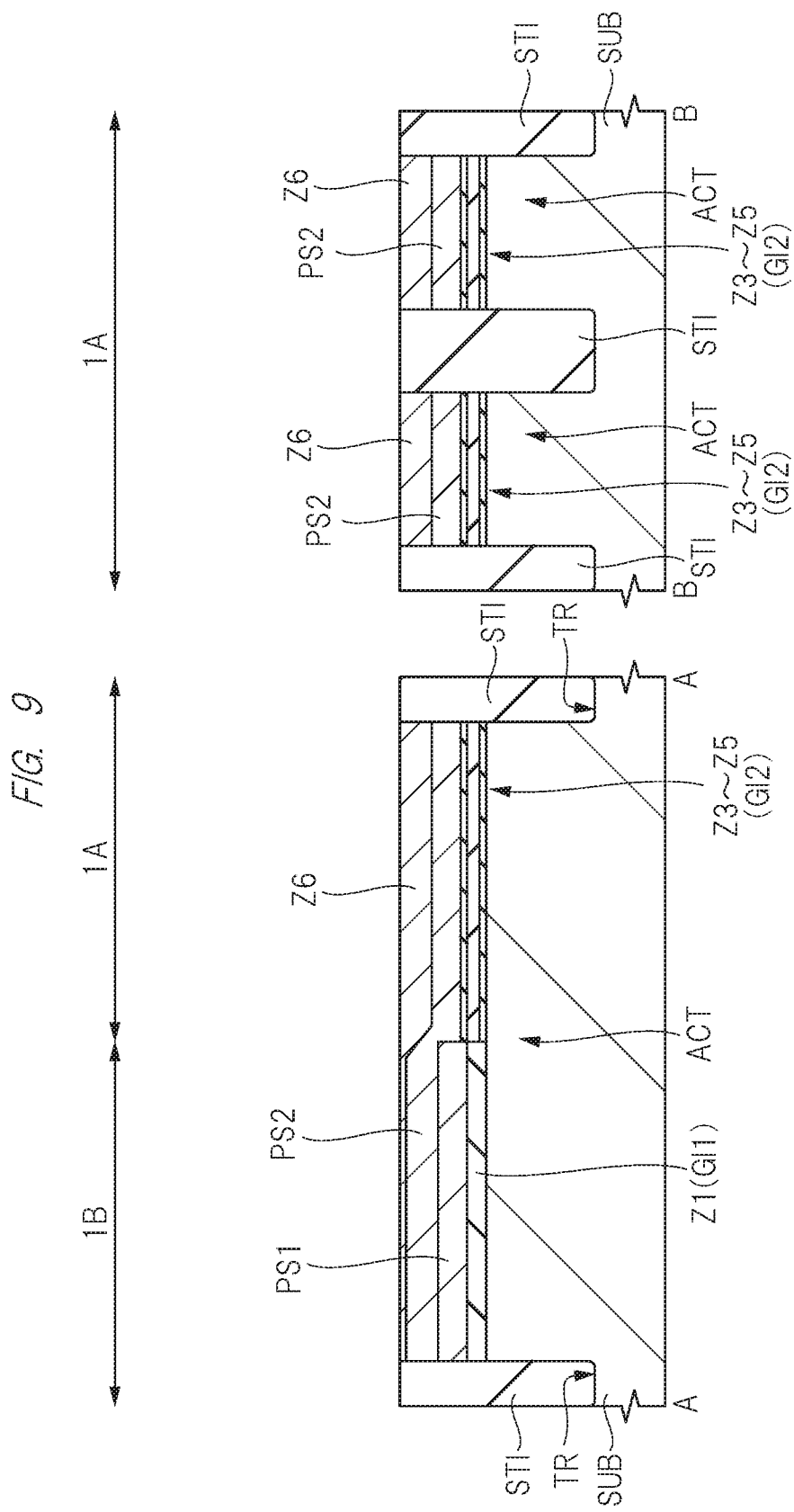
FIG. 9 is a cross-sectional view of a memory cell portion of a nonvolatile memory during the manufacturing process following FIG. 8.

Next, as shown in FIG. 9, an element isolation film STI is formed in the isolation trench TR. Specifically, a dielectric film made of, for example, a silicon oxide film is deposited on the dielectric layer Z6. Then, a dielectric film made of a silicon oxide film is filled in the isolation trench TR, and a dielectric film made of a silicon oxide film is buried in the isolation trench TR. Next, the dielectric film on the dielectric film Z6 is polished by a CMP (Chemical Mechanical Polishing) method or the like to remove an unnecessary dielectric film outside the isolation trench TR and leave a dielectric film in the isolation trench TR, whereby the element isolation film STI which fills the isolation trench TR can be formed. In this polishing step, it is preferable to polish the dielectric film Z6 in order to completely remove the dielectric film on the dielectric film Z6, but it is important to terminate the polishing step so as to leave the dielectric film Z6 thin. This is because, when the polysilicon layer PS2 is exposed in the polishing step, the polysilicon layers PS2 and PS1 are abruptly polished, making it difficult to control the thickness of the polysilicon layers PS2 and PS1. The above-mentioned "leaving the dielectric film Z6 thin" means that the thickness of the dielectric film Z6 after the polishing process is thinner than the thickness of the dielectric film Z6 before polishing (in other words, during deposition). Incidentally, the film thickness of the dielectric film Z6 after the polishing step is thinner than the film thickness of the dielectric film Z6 before polishing, in other words, during deposition, in both the memory transistor formation region 1A and the select transistor formation region 1B.

Figure 10:
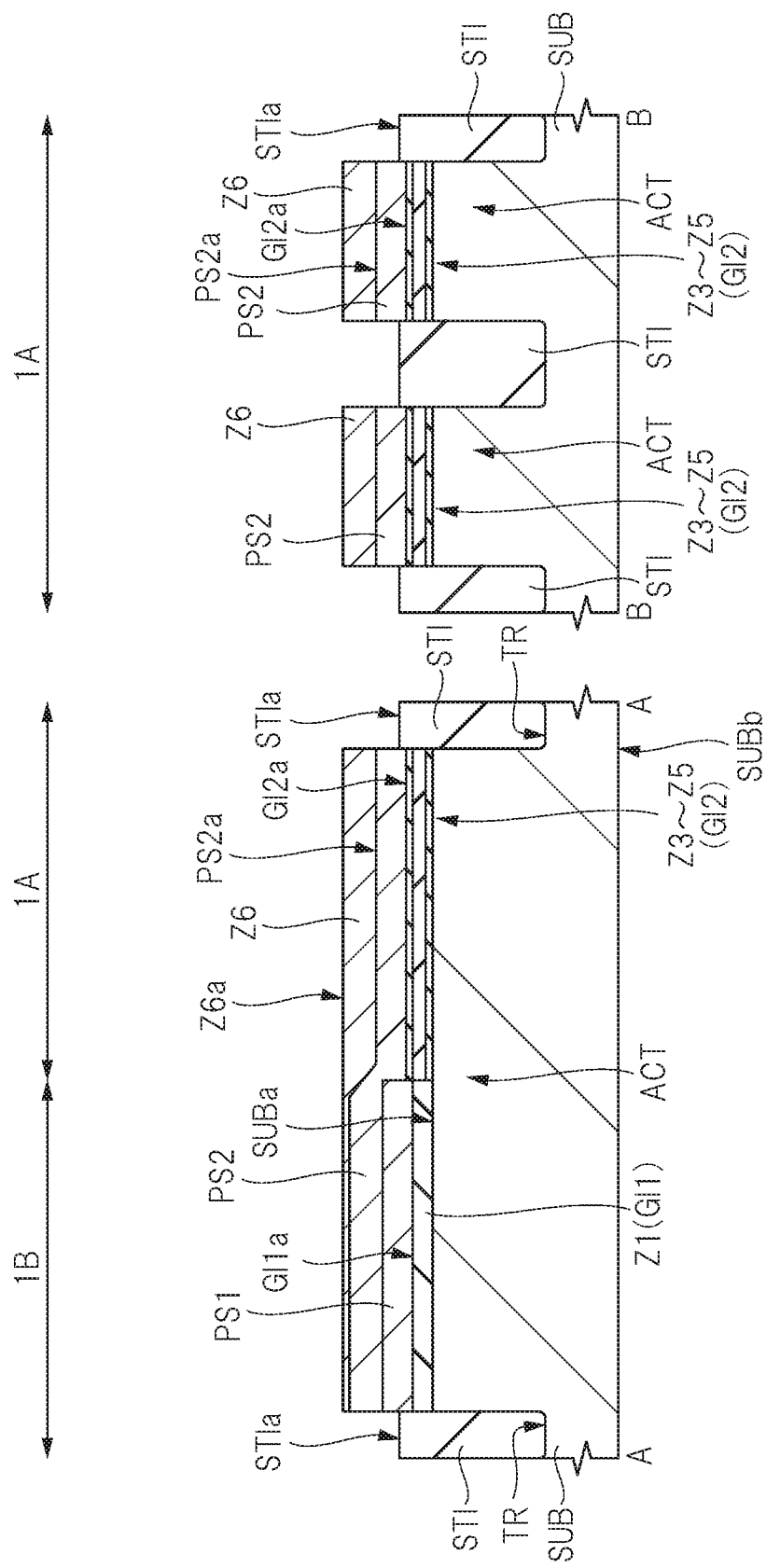
FIG. 10 is a cross-sectional view of a memory cell portion of a nonvolatile memory during the manufacturing process following FIG. 9.

Next, as shown in FIG. 10, the upper surface STIa of the element isolation film STI is lowered toward the back surface SUBb of the semiconductor substrate SUB. At the time of completing the polishing process described with reference to FIG. 9, the upper surface STIa of the element isolation film STI has a height substantially equal to the upper surface Z6a of the polished dielectric film Z6. In other words, the upper surface STIa of the element isolation film STI is higher than the upper surface of the polysilicon layer PS2. After the polishing process is completed, an etching treatment (referred to etch back) is performed to the element isolation film STI to retract the main surface SUBa side or the back surface SUBb side of the semiconductor substrate SUB. Here, the height is based on the main surface SUBa or the back surface SUBb of the semiconductor substrate SUB. The upper surface STIa of the element isolation film STI is preferably as low as possible. This is because a short circuit occurs between adjacent memory gate lines MGL, between adjacent select gate lines SGL, or between adjacent memory gate lines MGL and select gate lines SGL shown in FIG. 3. For example, it is preferred to lower than the upper surface PS2a of the polysilicon layer PS2 of the memory transistor formation region 1A. Preferably, however, it is higher than the upper surface GI1a of the gate dielectric film GI1 or the upper surface GI2a of the gate dielectric film GI2. This is because, when the upper surface STIa of the element isolation film STI is excessively lowered, the gate dielectric film GI1 or GI2 is damaged in the etching step, so that the withstand voltage of the gate dielectric film GI1 or GI2 is lowered at the interface between the gate dielectric film GI1 or GI2 and the element isolation film STI. Next, the dielectric film Z6 on the polysilicon layer PS2 is removed. The polysilicon layer PS2 can be etched back with the polished dielectric film 6 to prevent the polysilicon layer PS2 from being etched.

Figure 11:
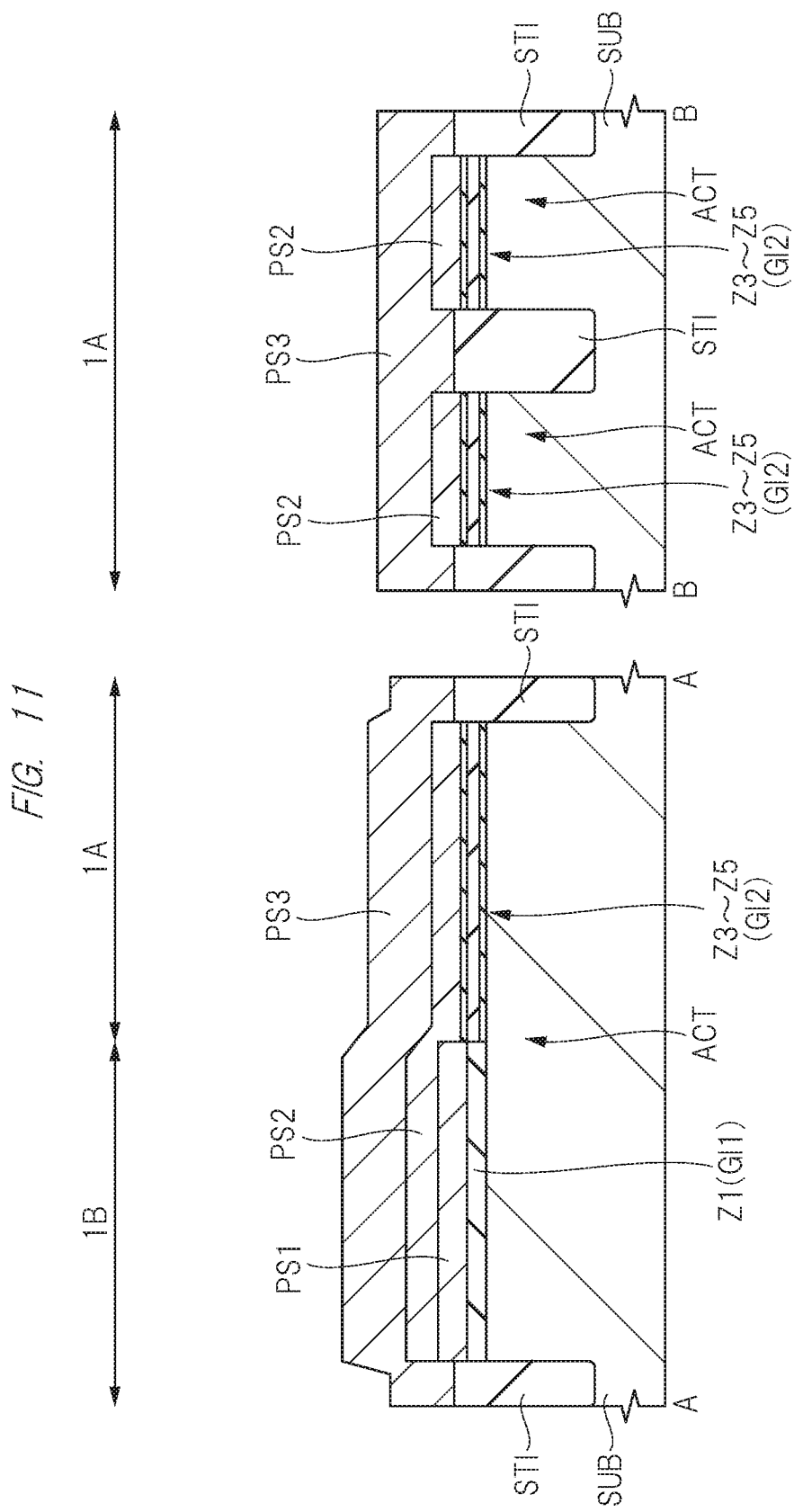
FIG. 11 is a cross-sectional view of a memory cell portion of a nonvolatile memory during the manufacturing process following FIG. 10.

Next, as shown in FIG. 11, a polysilicon layer PS3 is deposited on the polysilicon layer PS2 and the element isolation film STI in the memory transistor formation region 1A and the select transistor formation region 1B. The thickness of the n-type polysilicon layer PS3 is, for example, 130 to 150 nm. The thickness of the polysilicon layer PS3 is larger than the thickness of the polysilicon layers PS1 and PS2. As shown in the BB cross-sectional views of FIGS. 9 and 10, the polysilicon layers PS2 of the adjacent memory transistors MT are separated from each other in the Y direction of FIG. 3. The polysilicon layer PS3 electrically connects the separated polysilicon layers PS2 to each other.

Figure 12:
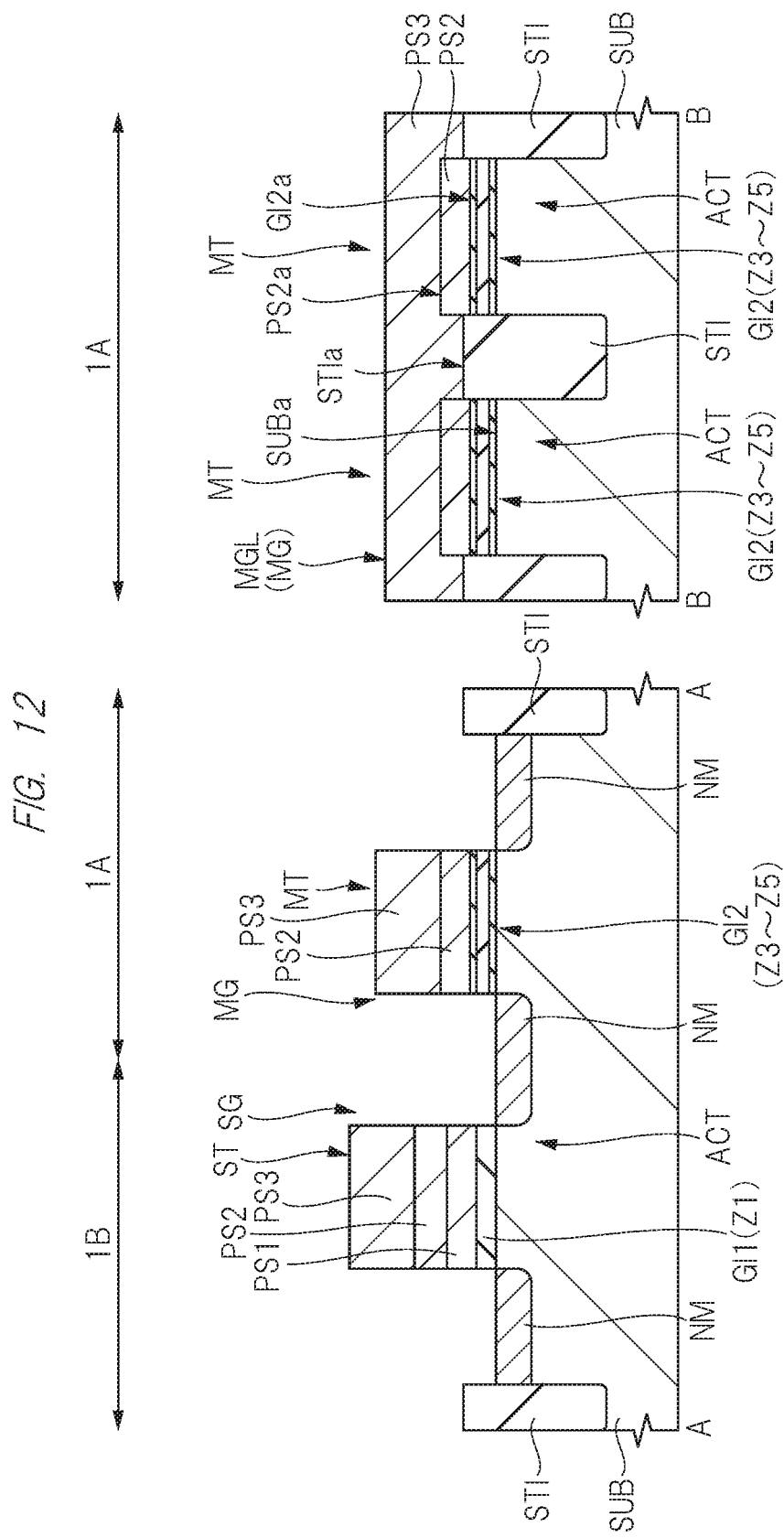
FIG. 12 is a cross-sectional view of a memory cell portion of a nonvolatile memory during the manufacturing process following FIG. 11.

Next, as shown in the AA cross-sectional view of FIG. 12, in the memory transistor formation region 1A, the polysilicon layers PS3 and PS2 and the dielectric films Z3 to Z5 are patterned to form a memory gate electrode MG and a gate dielectric film GI2. As shown in the BB cross-sectional view of FIG. 12, the memory gate lines MGL are formed by the patterned polysilicon layer PS3, and the polysilicon layers PS2 separated from each other are connected to each other by the memory gate lines MGL (polysilicon layer PS3). Further, as shown in the AA cross-sectional view of FIG. 12, in the select transistor formation region 1B, the polysilicon layers PS3 to PS1 and the dielectric film Z1 are patterned to form a select gate electrode SG and a gate dielectric film GI1. The polysilicon layer PS3 is patterned into the shapes of the memory gate line MGL and the select gate line SGL in FIG. 3. Although the gate dielectric films GI1 and GI2 are completely patterned in FIG. 12, the dielectric film Z1 of the gate dielectric film GI1 may be left thinly on the main surface SUBa of the semiconductor substrate SUB. Similarly, the dielectric film Z3 of the gate dielectric film GI2 may be thinly left on the main surface SUBa of the conductor substrate SUB.

Figure 15:
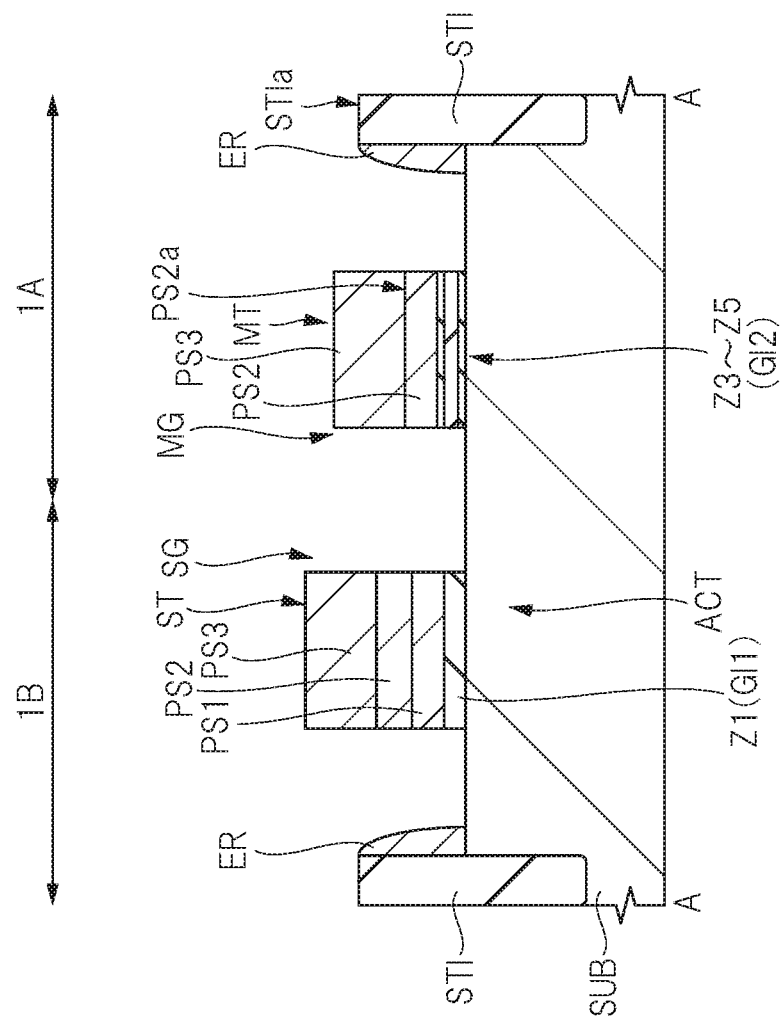
FIG. 15 is a cross-sectional view of a semiconductor device that is a comparative example during a manufacturing process.

Here, a method of manufacturing a semiconductor device as a comparative example will be described with reference to FIG. 15. FIG. 15 is a cross-sectional view (AA cross-sectional view) during a manufacturing process of a semiconductor device as a comparative example. The comparative example is an example in which the etch back described in FIG. 10 of the present embodiment is not performed. For example, the upper surface STIa of the element isolation film STI is higher than the upper surface PS2a of the polysilicon layer PS2 with reference to the main surface SUBa of the semiconductor substrate SUB. In such a state, when the memory gate electrode MG and the select gate electrode SG are patterned using an anisotropic dry etching method, an etching residue ER composed of a polysilicon layer remains along the sidewall of the element isolation film STI. That is, since the etching residue ER is formed on the sidewall of the element isolation film STI along the periphery of the active region ACT shown in FIG. 3, the present inventor has confirmed the problem that the etching residue ER short-circuits the adjacent memory gate lines MGL, the adjacent select gate lines SGL, or the adjacent memory gate lines MGL and the select gate lines SGL. In the present embodiment, the etching residue ER can be prevented from being formed by retracting the upper surface STIa of the element isolation film STI toward the back surface STIb of the semiconductor substrate SUB by performing an etch back process on the element isolation film STI.

Next, as shown in the AA cross-sectional view of FIG. 12, an n-type semiconductor region NM is formed in the semiconductor substrate SUB at both ends of the memory gate electrode MG and the select gate electrode SG. The semiconductor region NM is formed by ion-implanting an n-type impurity such as phosphorus or arsenic into the semiconductor substrate SUB. Since the ion implantation is performed by self-alignment with respect to the memory gate electrode MG and the select gate electrode SG, the semiconductor region NM is formed in the active region ACT and in a region exposed from the memory gate electrode MG and the select gate electrode SG. In the memory transistor MT and the select transistor ST, the semiconductor region NM may be formed in different processes or may have different impurity concentrations.

Figure 13:
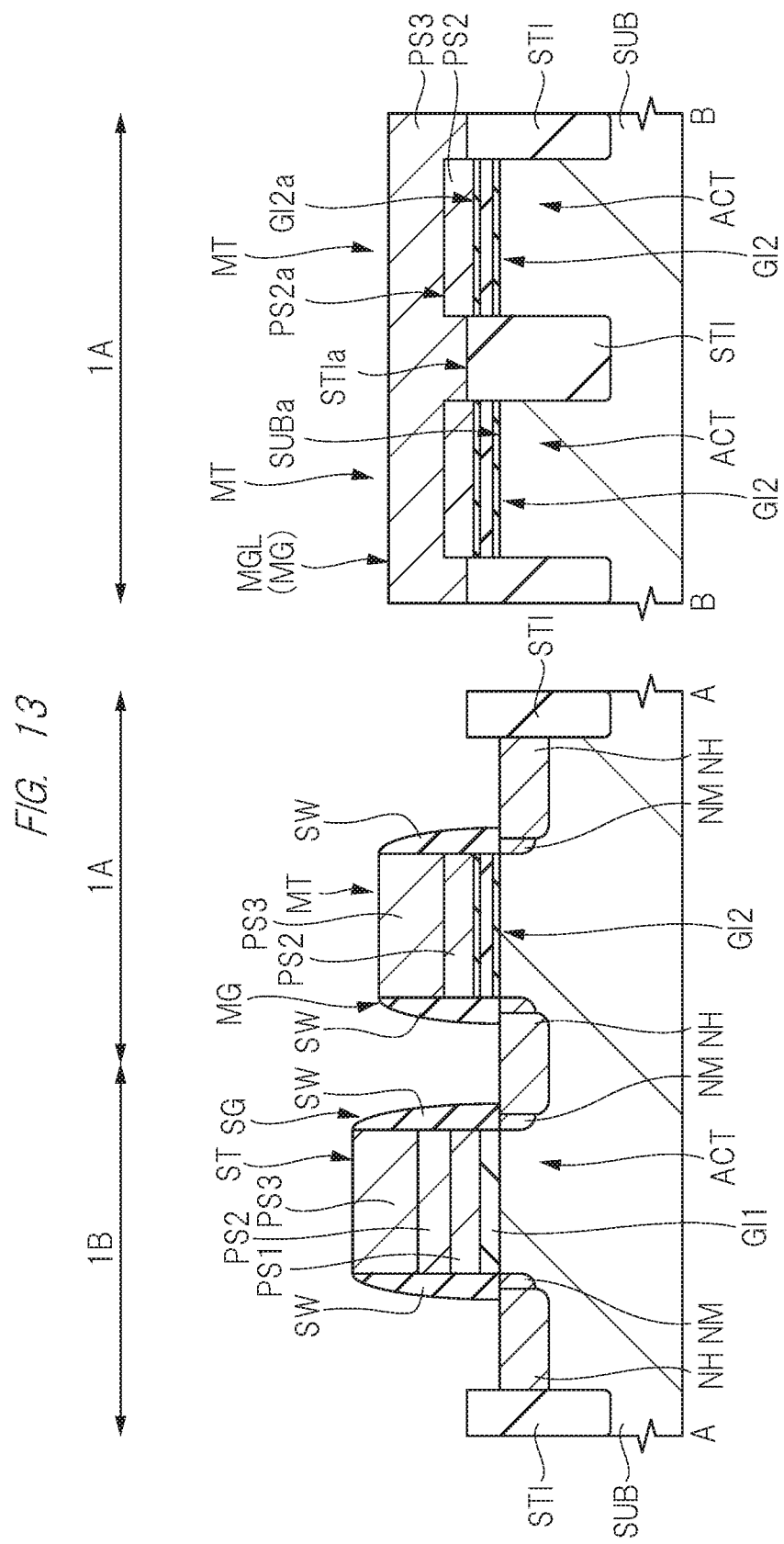
FIG. 13 is a cross-sectional view of a memory cell portion of a nonvolatile memory during the manufacturing process following FIG. 12.

Next, as shown in the AA cross-sectional view of FIG. 13, a sidewall dielectric film SW and a semiconductor region NH are formed. The sidewall dielectric film SW is formed on the sidewalls of the memory gate electrode MG and the gate dielectric film GI2, and on the sidewalls of the select gate electrode SG and the gate dielectric film GI1. For example, after a dielectric film for forming the sidewall dielectric film SW is deposited on the semiconductor substrate SUB, anisotropic dry etching is performed on the dielectric film to form the sidewall dielectric film SW. Next, an n-type semiconductor region NH is formed in the semiconductor substrate SUB at both ends of the memory gate electrode MG and the select gate electrode SG. The semiconductor region NH is formed by ion-implanting an n-type impurity such as phosphorus or arsenic into the semiconductor substrate SUB. Since the ion implantation is performed by self-alignment with respect to the memory gate electrode MG, the select gate electrode SG, and the sidewall dielectric film SW, the semiconductor region NH is formed in the active region ACT and in a region exposed from the memory gate electrode MG, the select gate electrode SG, and the sidewall dielectric film SW.

Figure 14:
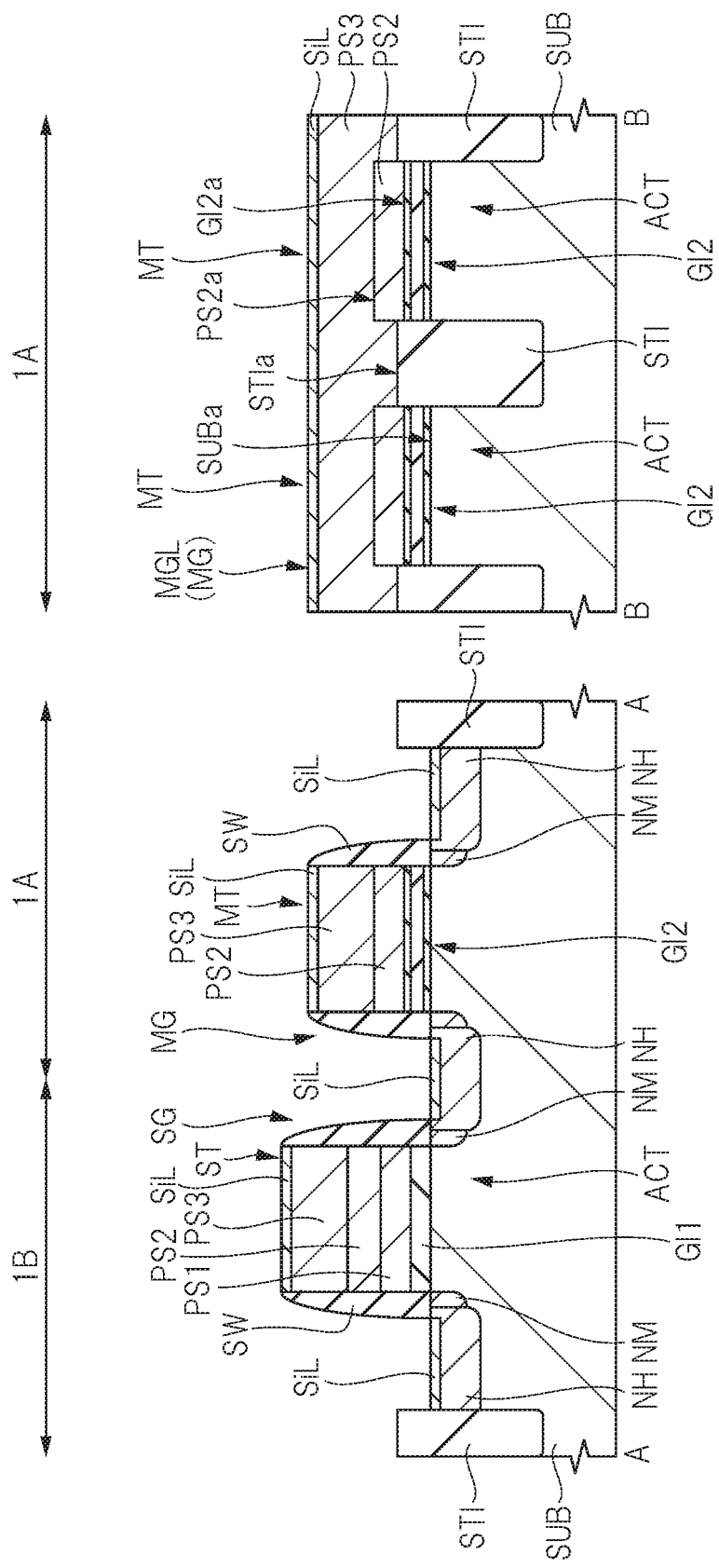
FIG. 14 is a cross-sectional view of a memory cell portion of a nonvolatile memory during the manufacturing process following FIG. 13.

Next, as shown in FIG. 14, a silicide layer SiL is formed on the upper surfaces of the semiconductor region NH, the memory gate electrode MG, and the select gate electrode SG.

Further, as shown in FIG. 4, an interlayer dielectric film IL1, a plug electrode PG1, a source line SL, a pad layer PD, an interlayer dielectric film IL2, and a bit line BL are formed in this order. The semiconductor device including the nonvolatile memory cell of present embodiment is formed through at least the above-described steps.

According to the method for manufacturing a semiconductor device of present embodiment, the following effects can be obtained.

After filling the isolation trench TR with a dielectric film, the dielectric film is polished to form an element isolation film STI formed of a dielectric film in the isolation trench TR. Thereafter, since the element isolation film STI is subjected to the etch back process, in the patterning process of the memory gate electrode MG or the select gate electrode SG, it is possible to prevent short-circuiting between the adjacent memory gate lines MGL, between the adjacent select gate lines SGL, or between the adjacent memory gate lines MGL and the select gate lines SGL.

In the etch back process, the upper surface STIa of the element isolation film STI is made lower than the upper surface PS2a of the polysilicon layer PS2, thereby preventing the short-circuit.

In the etch back step, the upper surface STIa of the element isolation film STI is made higher than the upper surface GI1a or GI2a of the gate dielectric film GI1 or GI2, so that the withstand voltage of the gate dielectric film GI1 or GI2 can be prevented from deteriorating.

Since the gate dielectric film GI1 for the select transistor ST is formed in the select transistor formation region 1B, and then the gate dielectric film GI2 for the memory transistor MT is formed in the memory transistor formation region 1A, it is possible to easily control the thickness of the gate dielectric film GI2, particularly, the dielectric film Z3 or Z5. In addition, it is possible to prevent variations in the writing and erasing characteristics of the memory cell MC. This is because, if the gate dielectric film GI2 is formed first and then the gate dielectric film GI1 is formed, the thickness of the gate dielectric film GI2, in particular, the dielectric film Z3 or Z5, varies due to the heat treatment at the time of forming the gate dielectric film GI1.

Figure 16:
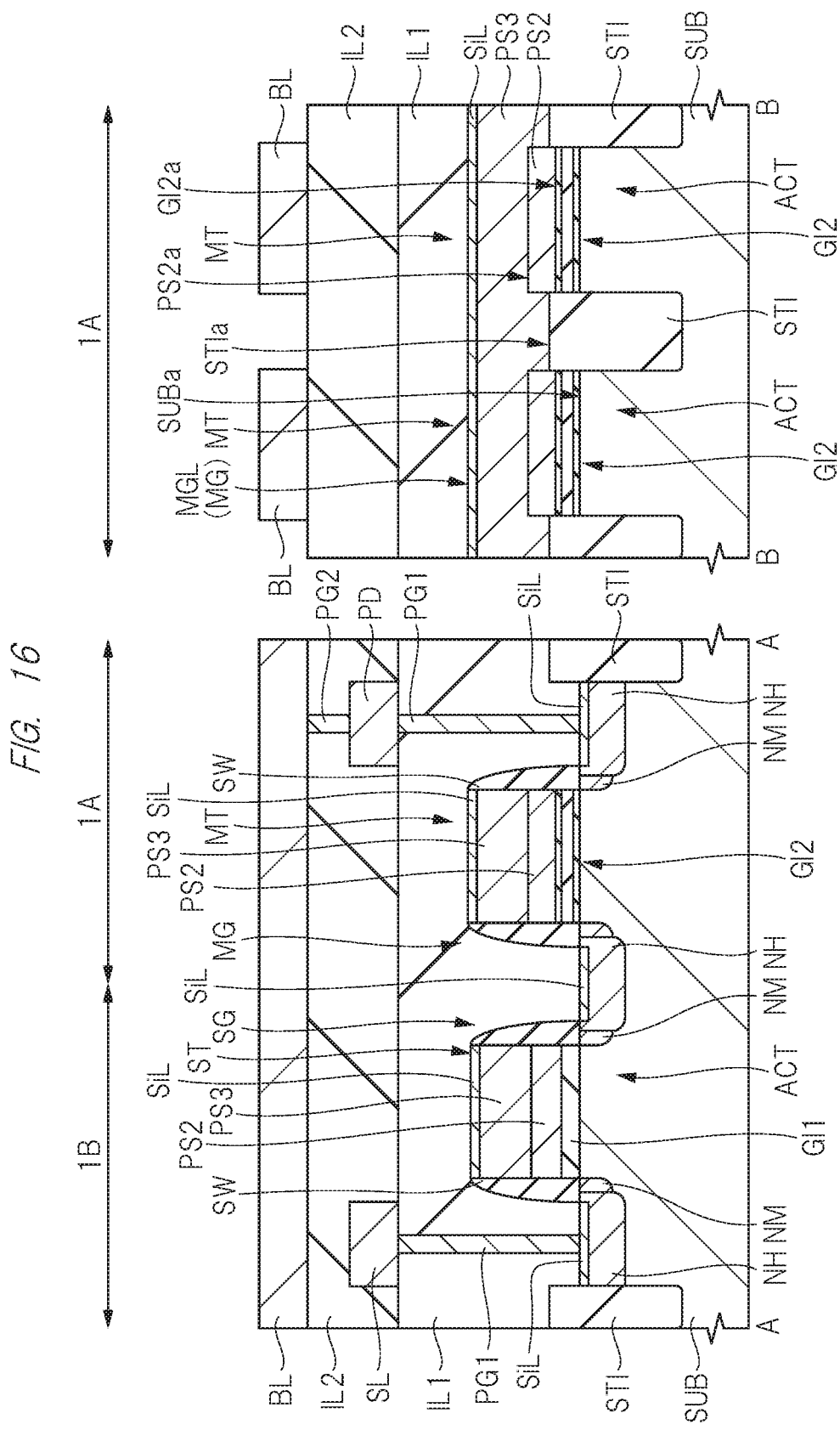
FIG. 16 is a cross-sectional view illustrating a structure of a memory cell portion of a nonvolatile memory of a semiconductor device according to a modified example.

Further, at the time of forming the gate dielectric film GI2, since the gate dielectric film GI1 formed previously is covered with the dielectric film Z2 made of a silicon nitride film, it is possible to prevent the thickness variation of the gate dielectric film GI1. In addition, since the polysilicon layer PS1 is interposed between the gate dielectric film GI1 and the dielectric film Z2, the film quality of the gate dielectric film GI1 can be prevented from deteriorating in the step of removing the dielectric film Z2. As a modified example, the polysilicon layer PS1 covering the gate dielectric film GI1 can be omitted. That is, in FIG. 6, the gate dielectric film GI1 of the select transistor formation region 1B is directly covered with the dielectric film Z2 without interposing the polysilicon layer PS1. FIG. 16 is a cross-sectional view showing the structure of the memory cell portion of the nonvolatile memory of the semiconductor device according to the modified example. By omitting the polysilicon layer PS1, the heights of the memory transistor MT and the select transistor ST can be made substantially equal to each other. That is, the step difference between the memory transistor formation region 1A and the select transistor formation region 1B can be alleviated.

Although the above embodiment has been described using the memory transistor MT and the select transistor ST, since the above-described high withstand voltage MISFET has the same configuration as the select transistor ST, the select transistor ST of the above embodiment can be read as a high withstand voltage MISFET. The low withstand voltage MISFET has the same configuration except that the thickness of the gate dielectric film is thinner than the thickness of the gate dielectric film GI1 of the select transistor ST. Therefore, except for the thickness of the gate dielectric film, the select transistor ST of the above embodiment can be read as a low withstand voltage MISFET. For example, when the select transistor ST is replaced with a p-type high withstand voltage MISFET, the semiconductor regions NM and NH constituting the source SS and drain SD of the select transistor ST are not n-type semiconductor regions but p-type semiconductor regions. Further, the memory gate electrode MG has a stacked structure of p-type polysilicon layers PS2 and PS3. Since the gate dielectric film GI1 formed earlier is covered with the dielectric film Z2 made of the silicon nitride film when the gate dielectric film GI2 is formed, it is possible to prevent NBTI (Negative Bias Temperature Instability) degradation of the p-type high withstand voltage MISFET. If the dielectric film Z3 constituting the gate dielectric film GI2 is subjected to the oxynitride treatment without covering the gate dielectric film GI1 with the dielectric film Z2 made of the silicon nitride film, for example, the nitrogen monoxide gas reaches the interface between the gate dielectric film GI1 and the semiconductor substrate SUB, and the NBTI of the p-type high withstand voltage MISFET is deteriorated.

The invention made by the present inventor has been described above in detail based on the embodiment, but the present invention is not limited to the embodiment described above, and it is needless to say that various modifications can be made without departing from the gist thereof. Part of the contents described in the above embodiments will be described below.

APPENDIX 1

A semiconductor device includes:

a semiconductor substrate having a main surface and a back surface, the main surface having a first active region and a second active region, an element isolation film filled in the semiconductor substrate between the first active region and the second active region and separating the first active region and the second active region from each other, a first gate dielectric film formed in the first active region on the main surface, a first polysilicon layer formed on the first gate dielectric film in the first active region, a second gate dielectric film formed in the second active region on the main surface, a second polysilicon layer formed on the second gate dielectric film in the second active region, and a third polysilicon layer connected to the first polysilicon layer and the second polysilicon layer and extending continuously on the first active region, the element isolation film and the second active region.

In the semiconductor device, each of the first gate dielectric film and the second gate dielectric film includes a first dielectric film, a second dielectric film formed on the first dielectric film and having a charge storage portion and a third dielectric film formed on the second dielectric film, and a first upper surface of the element isolation film is higher than a second upper surface of the first gate dielectric film and lower than a third upper surface of the first polysilicon layer with reference to the main surface of the semiconductor substrate.

APPENDIX 2

In the semiconductor device according to Appendix 1, the first upper surface of the element isolation film is higher than a fourth upper surface of the second gate dielectric film and lower than a fifth upper surface of the second polysilicon layer.

APPENDIX 3

In the semiconductor device according to Appendix 1,
the second dielectric film is formed of a silicon nitride film.

APPENDIX 4

In the semiconductor device according to Appendix 1,
the first dielectric film is formed of a silicon oxide film or a silicon oxynitride film.

APPENDIX 5

In the semiconductor device according to Appendix 1,
the third dielectric film is formed of a silicon oxide film or a silicon oxynitride film.

APPENDIX 6

A method of manufacturing a semiconductor device includes:

(a) preparing a semiconductor substrate having a main surface and a back surface, the main surface having a first region and a second region, (b) forming a first gate dielectric film on the main surface in the first region and the second region, (c) forming a first polysilicon layer and a first dielectric film covering the first gate dielectric film in the first region, (d) removing the first polysilicon layer exposed from the first polysilicon layer and the first dielectric film in the second region, (e) forming a second gate dielectric film in the second region on the main surface, (f) forming a second polysilicon layer on the first polysilicon layer in the first region and the second gate dielectric film in the second region after removing the first dielectric film, (g) forming a third dielectric film on the second polysilicon layer in the first region and the second region, (h) forming a first isolation trench in the semiconductor substrate through the third dielectric film, the second polysilicon layer, the first polysilicon layer and the first gate dielectric film and forming a second isolation trench in the semiconductor substrate through the third dielectric film, the second polysilicon layer and the second gate dielectric film in the second region, (i) depositing a fourth dielectric film on the third dielectric film and filling the first isolation trench and the second isolation trench with the fourth dielectric film, (j) performing a polishing process to the fourth dielectric film and the third dielectric film and removing the fourth dielectric film in the first region and the second region, thereby forming an element isolation film composed of the fourth dielectric film in the first isolation trench and the second isolation trench, (k) retracting a first upper surface of the element isolation film to the back surface of the semiconductor substrate by etching the element isolation film, (l) depositing a third polysilicon layer in the first region and the second region after removing the third dielectric film, and (m) forming a first gate electrode in the first region by subjecting the third polysilicon layer, the second polysilicon layer, and the first polysilicon layer by using an anisotropic dry etching method and forming a second gate electrode in the second region by subjecting the third polysilicon layer and the second polysilicon layer by using the anisotropic dry etching method.

In the method, the second gate dielectric film includes a fifth dielectric film, a sixth dielectric film formed on the fifth dielectric film and having a charge storage portion and a seventh dielectric film formed on the sixth dielectric film.

APPENDIX 7

In the method for manufacturing a semiconductor device according to Appendix 6,
the first dielectric film is formed of a silicon nitride film, and
the fifth dielectric film is formed by thermally oxidizing the main surface of the semiconductor substrate.

APPENDIX 8

In the method for manufacturing a semiconductor device according to Appendix 6,
in the step (j), a chemical mechanical polishing method is used, and the polishing process is terminated in a state which the third dielectric film left thinner than the thickness at the time of deposition in the first region and the second region.

APPENDIX 9

In the method for manufacturing a semiconductor device according to Appendix 6,
at the end of the step (k), the first upper surface is higher than the second upper surface of the seventh dielectric film with reference to the main surface of the semiconductor substrate.

APPENDIX 10

In the method of manufacturing a semiconductor device according to Appendix 6,
at the end of the step (k), the first upper surface is higher than the third upper surface of the first gate dielectric film with reference to the main surface of the semiconductor substrate.

What is claimed is:

1. A method of manufacturing a semiconductor device comprising the steps of:
   (a) preparing a semiconductor substrate including a main surface and a back surface;
   (b) forming a gate dielectric film on the main surface;
   (c) forming a first polysilicon layer on the gate dielectric film;
   (d) forming an isolation trench in the semiconductor substrate through the first polysilicon layer and the gate dielectric film;
   (e) depositing a first dielectric film on the first polysilicon layer and filling the isolation trench with the first dielectric film;
   (f) performing a polishing process to the first dielectric film and removing the first dielectric film on the first polysilicon layer, thereby forming an element isolation film formed of the first dielectric film in the isolation trench;
   (g) etching the element isolation film and retracting a first upper surface of the element isolation film to the back surface side of the semiconductor substrate;
   (h) depositing a second polysilicon layer on the element isolation film and the first polysilicon layer; and
   (i) subjecting the first polysilicon layer and the second polysilicon layer to form a gate electrode by using anisotropic dry etching method.

2. The method of manufacturing the semiconductor device according to claim 1,
   wherein the gate dielectric film includes a second dielectric film, a third dielectric film having a charge storage portion and formed on the second dielectric film, and a fourth dielectric film formed on the third dielectric film, and
   wherein at the end of the step (g), the first upper surface is higher than a second upper surface of the fourth dielectric film with reference to the main surface of the semiconductor substrate.

3. The method of manufacturing the semiconductor device according to claim 1,
   wherein at the end of the step (g), the first upper surface is lower than a third upper surface of the first polysilicon layer with reference to the main surface of the semiconductor substrate.

4. The method of manufacturing the semiconductor device according to claim 1,
   wherein in the step (f), chemical mechanical polishing method is used as the polishing process.

5. The method of manufacturing the semiconductor device according to claim 1, further comprising a step of:
   (j) after the step (c), before the step (d), depositing a fifth dielectric film on the first polysilicon layer,
   wherein in the step (d), the isolation trench is formed through the fifth dielectric film, and
   wherein in the step (f), the polishing process is performed to the first dielectric film and the fifth dielectric film, and is terminated in a state which the fifth dielectric film left thinner than a thickness at the time of deposition.

6. The method of manufacturing the semiconductor device according to claim 5,
   wherein the step (g) is performed in a state that the fifth dielectric film is left.

7. A method of manufacturing a semiconductor device comprising the steps of:
   (a) preparing a semiconductor substrate including a main surface and a back surface, the main surface having a first region and a second region;
   (b) forming a first gate dielectric film in the first region on the main surface and a second gate dielectric film in the second region on the main surface;
   (c) forming a first polysilicon layer on the first gate dielectric film and the second gate dielectric film;
   (d) forming a first isolation trench in the semiconductor substrate through the first polysilicon layer and the first gate dielectric film in the first region, and forming a second isolation trench in the semiconductor substrate through the first polysilicon layer and the second gate dielectric film in the second region;
   (e) depositing a first dielectric film on the first polysilicon layer and filling the first isolation trench and the second isolation trench with the first dielectric film;
   (f) performing a polishing process to the first dielectric film and removing the first dielectric film on the first polysilicon layer, thereby forming an element isolation film formed of the first dielectric film in the first isolation trench and the second isolation trench;
   (g) etching the element isolation film and retracting a first upper surface of the element isolation film to the back surface side of the semiconductor substrate;
   (h) depositing a second polysilicon layer on the element isolation film and the first polysilicon layer; and
   (i) subjecting the first polysilicon layer and the second polysilicon layer to form a first gate electrode in the first region and a second gate electrode in the second region by using an anisotropic dry etching method.

8. The method of manufacturing the semiconductor device according to claim 7,
wherein the second dielectric film includes a second dielectric film, a third dielectric film formed on the second dielectric film and having a charge storage portion and a fourth dielectric film formed on the third dielectric film;
wherein at the end of the step (g), the first upper surface is higher than a second upper surface of the fourth dielectric film and lower than a third upper surface of the first polysilicon layer with reference to the main surface of the semiconductor substrate.

9. The method of manufacturing the semiconductor device according to claim 8,
wherein at the end of the step (g), the first upper surface is higher than a fourth upper surface of the first gate dielectric film with reference to the main surface of the semiconductor substrate.

10. The method of manufacturing the semiconductor device according to claim 7, further comprising a step of:
(j) after the step (c), before the step (d), depositing a fifth dielectric film on the first polysilicon layer,
wherein in the step (d), the first isolation trench and the second isolation trench are formed through the fifth dielectric film, and
wherein in the step (f), the polishing process is performed to the first dielectric film and the fifth dielectric film, and is terminated in a state which the fifth dielectric film left thinner than a thickness at the time of deposition in the first region and the second region.

11. The method of manufacturing the semiconductor device according to claim 10,
wherein, in the first region and the second region, the step (g) is performed in a state that the fifth dielectric film is left.

12. The method of manufacturing the semiconductor device according to claim 7,
wherein the step (b) further comprises:
(b-1) forming the first gate dielectric film on the main surface in the first region and the second region,
(b-2) removing the first gate dielectric film in the second region and leaving the first gate dielectric film in the first region, and
(b-3) forming the second gate dielectric film on the main surface in the second region.

13. The method of manufacturing the semiconductor device according to claim 12, further comprising a step of:
(b-4) after the step (b-1), before the step (b-2), forming a sixth dielectric film formed of a silicon nitride film, the sixth dielectric film covering the first gate dielectric film in the first region and exposing the first gate dielectric film in the second region.

14. The method of manufacturing the semiconductor device according to claim 13,
wherein in the step (b-3), the second dielectric film is formed by thermally oxidizing the main surface of the semiconductor substrate.

15. The method of manufacturing the semiconductor device according to claim 13,
wherein the step (b-4) includes a step of forming a third polysilicon layer between the first gate dielectric film and the sixth dielectric film.

* * * * *